United States Patent [19]

Lau

[11] Patent Number: 4,768,961
[45] Date of Patent: Sep. 6, 1988

[54] JACKFIELD WITH FRONT REMOVABLE JACK MODULES HAVING LAMP ASSEMBLIES

[75] Inventor: Frederick L. Lau, Skokie, Ill.

[73] Assignee: Switchcraft, Inc., Chicago, Ill.

[21] Appl. No.: 106,291

[22] Filed: Oct. 9, 1987

[51] Int. Cl.[4] ............... H01R 9/09; H05K 7/10
[52] U.S. Cl. .................... 439/61; 361/415; 439/490
[58] Field of Search ............... 439/59–64, 439/668, 490; 361/413, 415

[56] References Cited

U.S. PATENT DOCUMENTS

| 3,327,072 | 6/1967 | Willmann et al. | 361/415 |
| 3,335,386 | 8/1967 | Upton | 439/64 |
| 3,573,558 | 4/1971 | Babcock | 361/415 |
| 3,710,194 | 1/1973 | Zammit et al. | 361/415 |
| 3,818,280 | 6/1974 | Smith et al. | 361/415 |
| 4,047,781 | 9/1977 | Denigris et al. | 361/415 |
| 4,377,315 | 3/1983 | Grau | 439/64 |
| 4,483,178 | 11/1984 | Miille | 361/415 |

Primary Examiner—Neil Abrams
Attorney, Agent, or Firm—William R. Clark; Richard M. Sharkansky

[57] ABSTRACT

A jackfield with front removable jack modules having lamp assemblies. Each jack module includes a printed circuit board having a lamp assembly and a tri-jack extending forwardly therefrom. Conductor pads at the rear of the printed circuit board removably engage contact spring terminals interconnected to lateral busses. One bus provides a voltage and the other provides ground for the lamp assembly. One of the circuit leads is routed through the jack so that when a plug is inserted into the jack, the lamp is lit. The module also has wire wrap lugs extending from the rear, and the wire wraps are disconnected before the module is removed to the front. Apparatus is also provided for retaining the module from forward movement when only the tri-jack is to be removed.

6 Claims, 5 Drawing Sheets

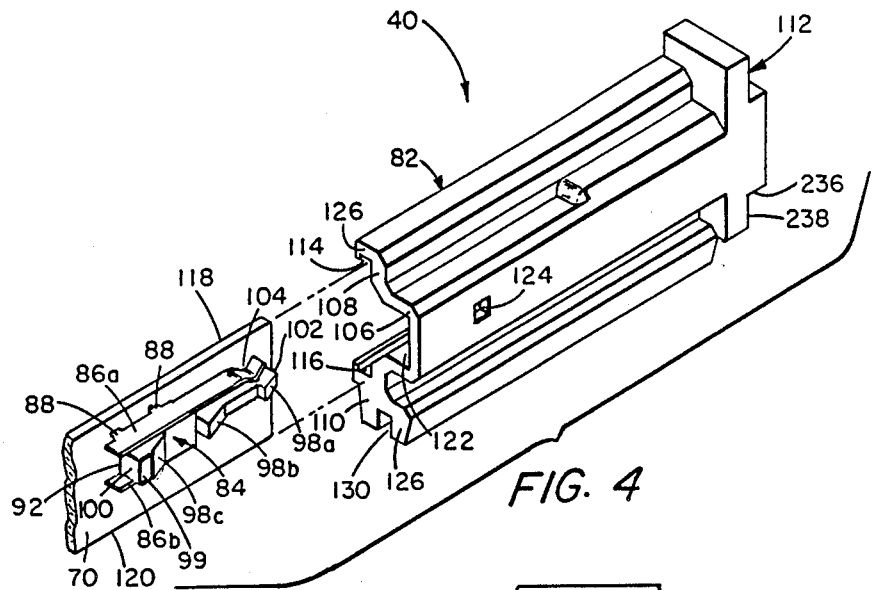
FIG. 4
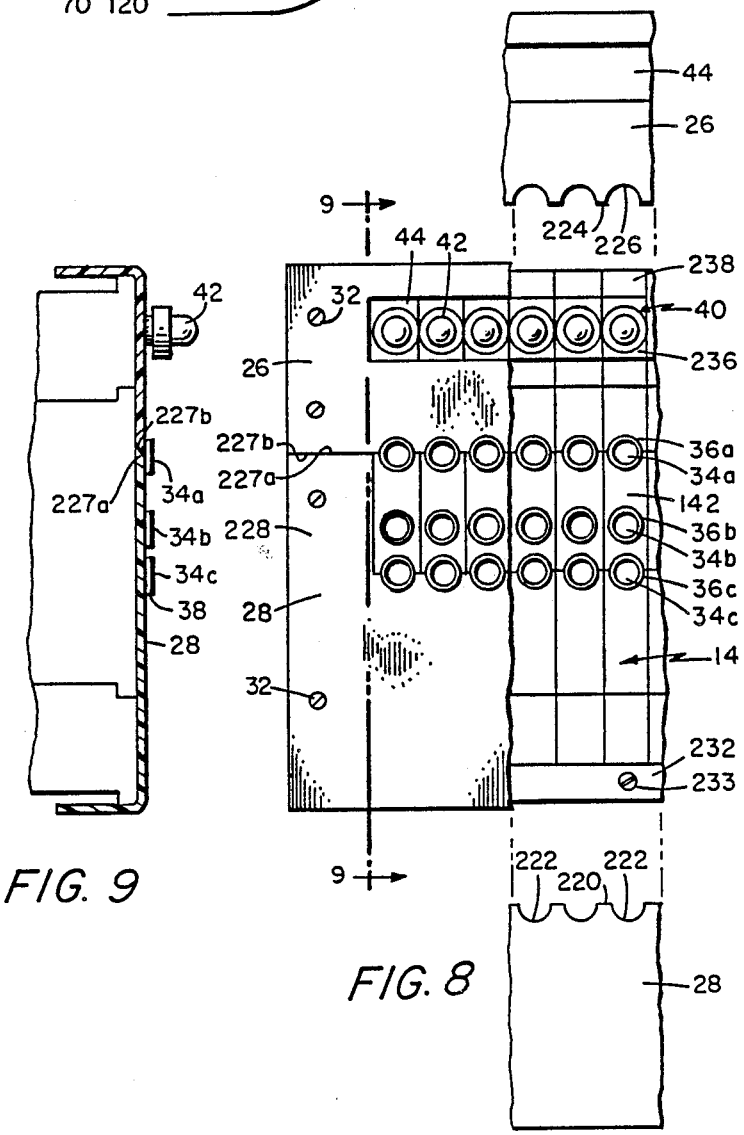
FIG. 9
FIG. 8

JACKFIELD WITH FRONT REMOVABLE JACK MODULES HAVING LAMP ASSEMBLIES

BACKGROUND OF THE INVENTION

The field of the invention generally relates to electrical jacks, and more particularly to a jack module including a printed circuit board and lamp assembly which is removable from the front of a jackfield housing.

Electrical jacks are commonly used for digital or voice frequency interconnections in applications such as, for example, telephone central offices, testing and patch panels, computer and data processing equipment, multiplex gear, and commercial and industrial patching and control applications. Typically, a plurality of jacks each of which may have, for example, three forward facing jack sleeves are arranged side-by-side in a housing or enclosure that mounts in a rack. In the normal configuration, input and output circuits are connected to the back, and the jack sleeves are available on the front for inserting patch cord plugs to interconnect, monitor, or test circuits.

A jackfield including jack modules is described in U.S. patent application Ser. No. 14,909, filed Feb. 13, 1987. Therein, each jack module includes a printed circuit board having a front right-angle connector, a tri-jack assembly having pins inserted into the connector, and a forward extending lamp housing connected to the printed circuit board above the connector. In initial assembly and also for later service or reconfiguration, the tri-jacks are inserted and removed from the front of the jackfield housing, while the printed circuit boards are removed from the rear. In order to provide voltage and ground to each of the printed circuit boards for lighting the lamps, bus strips were run laterally in the jackfield housing between the connectors and the tri-jacks, and the strips had perpendicular pins which inserted into connector terminals. In some applications, this jackfield had a drawback because the printed circuit boards could not be removed from the front. Among other reasons, the bus strips running laterally in front of the printed circuit boards prevented their front removal. Further, if the printed circuit boards are removed from the rear such as for service or to change the configuration, it is difficult to align the bus pins into the printed circuit board connector.

SUMMARY OF THE INVENTION

It is an object of the invention to provide a jackfield having jack modules that are removable from the front for service or reconfiguration.

It is also an object to provide a jackfield having jack modules each comprising a printed circuit board, lamp assembly, and a tri-jack wherein each module can be removed from the front of the jackfield housing.

It is a further object to provide a front removable jack module including a lamp and a printed circuit board having leads interconnecting the lamp to rear conductor pads on the printed circuit board, which conductor pads automatically align in sliding engagement with laterally extending busses in the jackfield housing. It is also an object that the busses have contact springs which are readily engageable and disengageable and in self-alignment with the conductor pads that are located at different vertical levels on the printed circuit board.

These and other objects and advantages are provided by the invention which defines a jack module adapted for front insertion and removal from guide slots in a jackfield housing, comprising a printed circuit board having top and bottom edges insertable for longitudinal sliding engagement in the slots, a lamp having a lamp housing connected to and extending forwardly from the printed circuit board, a jack connected to and extending forwardly from the printed circuit board, the jack having terminals electrically connected to the printed circuit board, and the printed circuit board having at least one rear conductor pad adapted for sliding removable engagement with contact spring terminals at the back of the jackfield housing wherein the jack module can be inserted from the front of the jackfield housing in one of the guide slots with the conductor pad electrically engaging the contact spring terminal, the printed circuit board having a conductor lead for interconnecting the conductor pad to the lamp. It is also preferable that the printed circuit board have at least a second rear conductor pad adapted for sliding removable engagement with a second contact spring terminal, the module further comprising a circuit through the jack interconnecting the second conductor pad with the lamp. Also, it is preferable that the circuit from the second conductor pad through the jack to the lamp be activated by insertion of a plug into the jack. It is also preferable that the contact spring and the second contact spring terminals be connected to respective busses that provide a voltage and ground to the lamp for lighting the lamp in response to the plug being inserted into the jack. Further, it is preferable that the printed circuit board comprise a plurality of wire wrapped lugs extending from the rear and a plurality of conductor leads for interconnecting the lugs to the jack. Accordingly, to remove a module from the front, the wire wraps are removed from the wire wrapped lugs, and the module is pulled forward such that the contact spring terminals slidably disengage the conductor pads.

The invention may also be practiced by a jackfield comprising a jackfield housing having a plurality of longitudinal slots each having at least two vertical levels of contact spring terminal connectors aligned therewith, the contact spring terminal connectors on one of the levels being interconnected to a voltage bus, the contact spring terminal connectors on the other one of the levels being interconnected to a ground bus, a plurality of jack modules slidably engaged in the longitudinal slots, each of the modules comprising a printed circuit board having top and bottom edges slidably engaged in the slots of the housing, a lamp having a lamp housing connected to and extending forwardly from the printed circuit board, a jack connected to and extending forwardly from the printed circuit board underneath the lamp housing, the jack having a plurality of forward facing jack sleeves, the jack having a circuit activated by insertion of a plug in one of the jack sleeves, the jack being electrically interconnected to the conductor leads of the printed circuit board, and the printed circuit board having at least two rear conductor pads vertically aligned for respective removable engagement with the two levels of contact spring terminal connectors wherein the module is removable from the front of the housing, one of the conductor pads being electrically interconnected with the lamp and the other of the conductor pads being electrically interconnected with the lamp through the circuit within the jack. It is also preferable that the jackfield further comprise metal shields positioned between adjacent ones of the slots, the metal shields comprising means for preventing the removal of the shields toward the front of the housing. It is also preferable that the jackfield housing further comprise means for restraining forward motion of the modules when only the jacks are to be removed.

BRIEF DESCRIPTION OF THE DRAWINGS

The above objects and advantages will be more fully understood by reading the Description of the Preferred Embodiment with reference to the drawings wherein:

FIG. 4 is an exploded view of the lamp assembly;

FIG. 8 is a front view of a jackfield; and

FIG. 9 is a view taken along line 9—9 of FIG. 8.

DESCRIPTION OF THE PREFERRED EMBODIMENT

Figure 1:
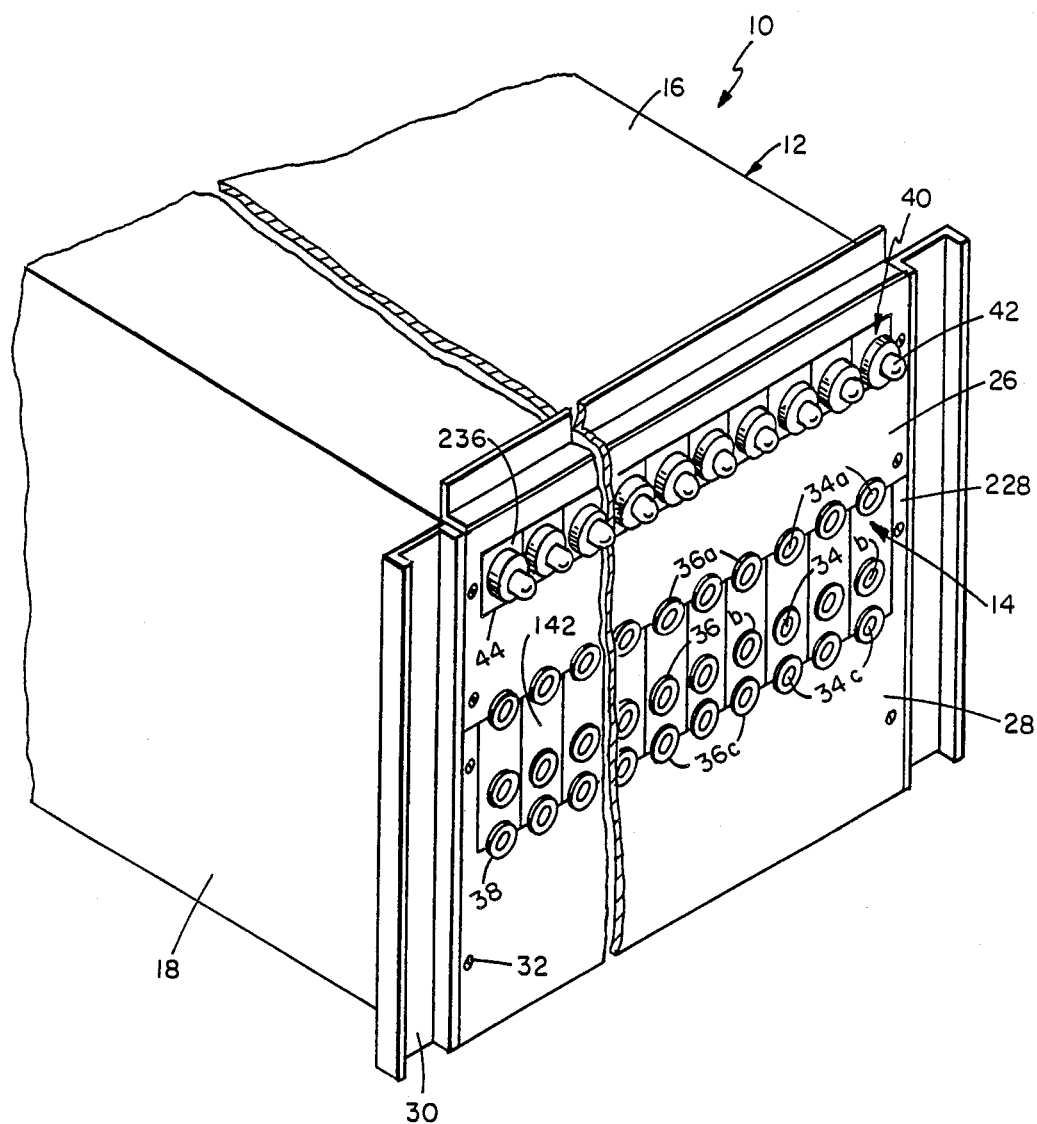
FIG. 1 is a front perspective view of a jackfield.

Referring to the drawings wherein like characters of reference designate like parts throughout the various views, FIG. 1 shows a front perspective view of electrical jackfield assembly 10 which includes an enclosure or housing 12 and a plurality of vertically elongated modules 14 that are backwardly extending and mounted side-by-side. Housing 12 is an electromagnetic shielded casing and includes top plate 16, side plates 18, top and bottom rear plates 20 and 22 (FIG. 3), bottom plate 24 (FIG. 3), and top and bottom front plates or panels 26 and 28. Typically, jackfield assembly 10 is mounted in a standard 23-inch rack (not shown) and mounting brackets 30 are provided for this purpose. Top and bottom front panels 26 and 28, which will be described in more detail later herein, are connected to the front using screws 32 or other suitable fasteners.

Still referring to FIG. 1, a standard jackfield assembly 10 may consist of 56 side-by-side mounted modules, although other numbers could be used in various configurations. Each module 14 here has three vertically aligned plug receiving apertures 34a–c or bores, and thus the modules 14 are commonly referred to as tri-jack modules. Although the invention could be used to advantage with a variety of different types of modules 14, here bore 34a is used to monitor the module 14, bore 34b is used to patch a circuit out of module 14, and bore 34c is used to patch a circuit into module 14. Each plug receiving bore 34a–c is surrounded by a cylindrical jack sleeve 36a–c that has a collar 38. Each module 14 has a lamp assembly 40 with a lamp 42 that protrudes through an elongated lateral window 44 in the top front panel 26.

Figure 2:
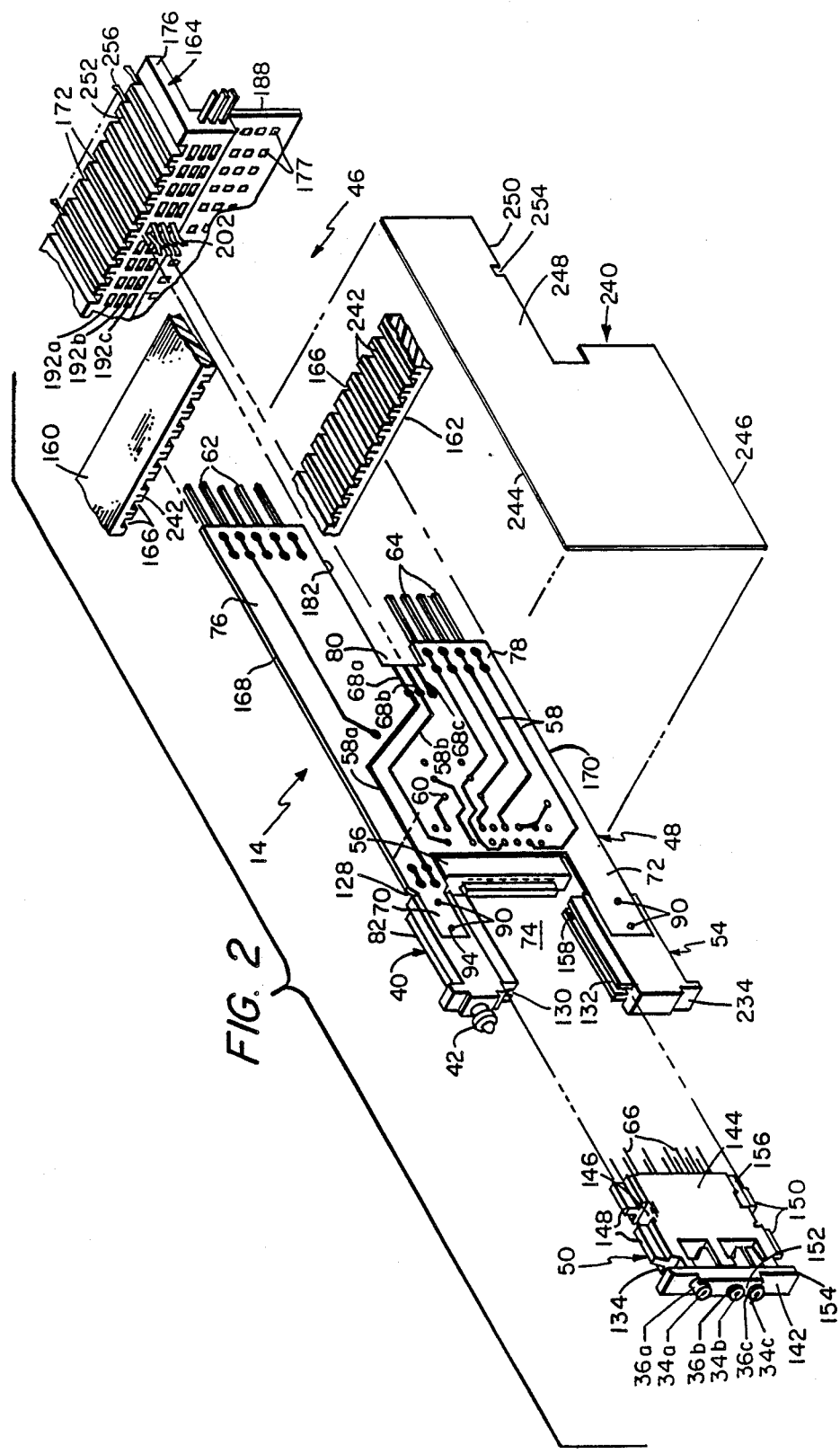
FIG. 2 is an exploded view of a jack module with associated guide apparatus.

Referring to FIG. 2, an exploded view of a tri-jack module 14 with associated guide apparatus 46 is shown. Tri-jack module includes printed circuit board 48, a tri-jack assembly 50, a lamp assembly 40, a bottom guide housing 54 for tri-jack assembly 50, and a right-angle connector 56.

Printed circuit board 48 is of conventional construction such as a multi-layer epoxy glass board having a plurality of conductor leads 58 which are deposited in a predetermined pattern on both sides of printed circuit board 48. In FIG. 2, only the conductor leads 58 on one side of printed circuit board 48 are shown, and it is well known and conventional to interconnect conductor leads 58 from the opposite side at terminals such as right-angle connector 56 and at conductive eyelets 60. Here, the function of printed circuit board 48 is to interconnect wire wrap lugs or pins 62 and 64 through right-angle connector 56 to corresponding terminal pins 66 of tri-jack assembly 50. Further, as will be described in detail later herein, printed circuit board 48 interconnects conductor pads 68a–c to corresponding terminals of lamp assembly 40 and right-angle connector 56.

Figure 3:
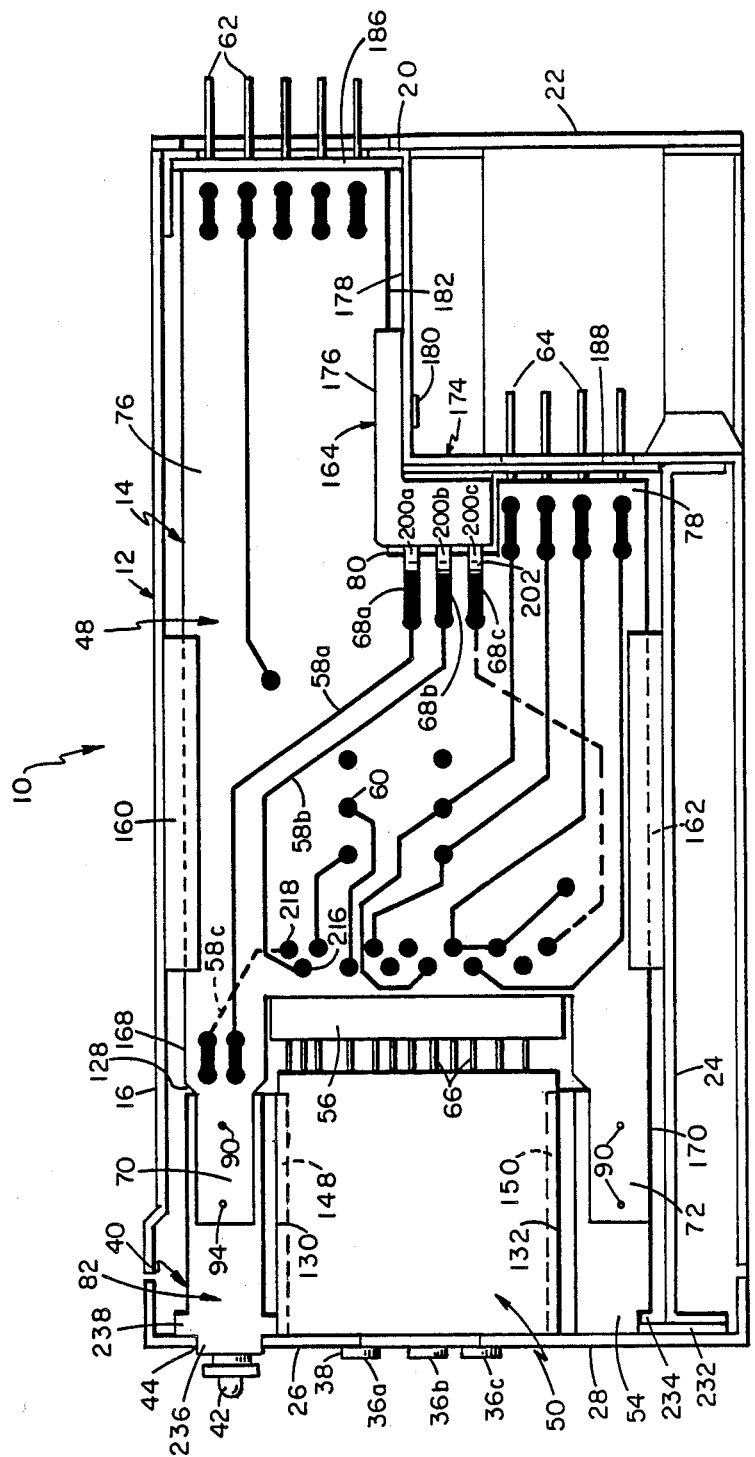
FIG. 3 is a side view of a jack module mounted in the jackfield.

Still referring to FIG. 2 and also to FIG. 3 which shows a side section view of jackfield assembly 10, printed circuit board 48 has top and bottom forwardly projecting posts or necks 70 and 72, respectively, which define a notch 74 therebetween. Also, printed circuit board 48 has top and bottom rearward projections 76 and 78, respectively, which define a notch 80 therebetween. As can be seen best in FIG. 2, top rearward projection 76 on which wire wrap lugs 62 are mounted extends much further than bottom rearward projection 78 on which wire wrap lugs 64 are mounted. Conductor pads 68a–c are positioned inwardly from notch 80.

Still referring to FIG. 2, lamp assembly 40 is connected to top forwardly projecting neck 70 of printed circuit board 48. With further reference to FIG. 4, there is shown an exploded perspective view of lamp assembly 40 from the opposite side of that shown in FIG. 2. Lamp assembly 40 includes lamp housing 82, lamp housing retainer 84, conductor strips 86a and b, and a lamp 42. In fabrication, pins 88 of two conductor strips 86a and b are inserted through eyelets (not shown) in neck 70 and soldered in place so that conductor strips 86a and b are parallel and extend horizontally forward. Next, lamp housing retainer 84 or center lamp post is inserted between conductor strips 86a and b. Lamp housing retainer 84 is a molded plastic part and has two positioning pins 90 extending laterally from a flat side 92 that seats up against the neck 70 of printed circuit board 48. Retainer positioning pins 90 insert through small holes 94 in neck 70 thereby accurately locating lamp housing retainer 84 and preventing it from moving in a longitudinal or vertical direction. On the side opposite flat side 92 there are a series of three ramps 98a, b and c, with ramp 98c defining a retaining boss 99 with a flat top terminating at a back side wall 100. The front 102 of lamp housing retainer 84 is pointed, and is contacted on top and bottom by contact terminals 104 of conductor strips 86a and b which are spring tensioned against the top and bottom of retainer front 102.

Lamp housing 82 is a plastic molded part that includes a hollow trunk 106, upward and lower legs 108 and 110, and a face portion 112. Upper leg 108 has a downwardly facing guide channel 114 or track and lower leg has a corresponding upwardly facing guide channel 116 or track. Channels 114 and 116 face each other and are spaced so as to receive respective parallel upper and lower edges 118 and 120 of neck 70. In assembly, edges 118 and 120 are seated in respective guide channels 114 and 116, and then lamp housing 82 is pushed back onto neck 70. There is an interference fit between the inside wall 122 of hollow trunk 106 and lamp housing retainer 84. The three ramps 98a–c guide inside wall 122 away from neck 70 and also prevent lamp housing 82 from engaging or being snagged on conductor strips 86a and b. Hollow trunk 106 has a small aperture 124 which aligns with ramps 98a–c. Lamp housing 82 is pushed onto neck 70 until aperture 124 aligns with retaining boss 99 at which point edge 126 at the end of channels 114 and 116 engages a shoulder 128 of neck 70. At this position, retaining boss 99 snaps into aperture 124 due to the interference fit. The back side wall 100 of lamp housing retainer 84 engages the rear edge of aperture 124 and prevents lamp housing 84 from being slid off of neck 70. Thus, lamp housing 82 is securely attached to neck 70 and disengagement of ramp housing 82 from neck 70 is prevented. Lamp housing has a front central bore (not shown) through which lamp 42 is inserted. Each lamp has a pair of leads (not shown) which respectively insert on the top and bottom at the front 102 of lamp housing retainer 84 and are contacted by respective contact terminals 104 of conductor strips 86a and b. At the bottom of lower leg 110 is a downwardly facing guide channel 130 or track which, as will be described later herein, functions to mount tri-jack assembly 50. As will be described later herein, face portion 112 has a rectangular neck 236 which inserts through window 44 with shoulder 238 seating up against the back of top front panel 26.

Bottom guide housing 54 is similar although symmetrically different than lamp housing 82. Bottom guide housing 54 connects onto bottom forward projecting neck 72 in the same manner as lamp housing 82 connects onto neck 70. More specifically, a lamp housing retainer 84 having positioning pins 90 is seated against bottom neck 72 and bottom guide housing 54 having guide channels similar to guide channels 114 and 116 is pushed onto neck 72 and locked in place as shown in FIG. 2. Bottom guide housing 54 has an upward facing guide channel 132 or track which aligns directly under guide channel 130 of lamp housing 82.

Figure 5:
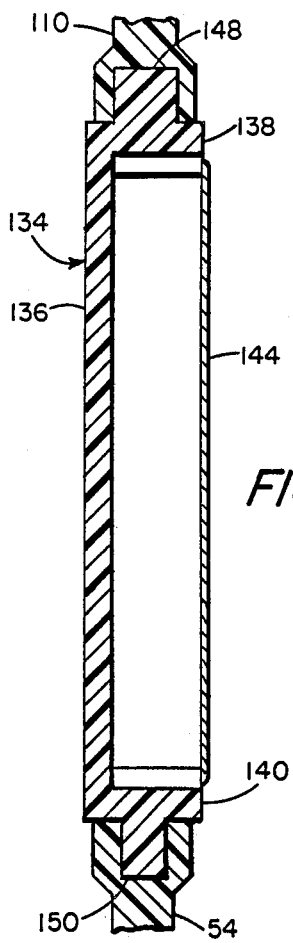
FIG. 5 is a front sectioned view of a tri-jack.

Still referring to FIG. 2, and also to FIG. 5 which shows a front sectioned view of tri-jack assembly 50 mounted as part of tri-jack module 14, tri-jack assembly 50 has a plastic molded housing 134 which defines the left side wall 136, the roof 138, the floor 140, and the front face plate or face bracket 142. The right wall 144 is a metal shield with clips 146 that secure it to plastic molded housing 134. Roof 138 has a pair of upwardly projected guide rails 148 or runners, and floor 140 has a pair of downwardly projected guide rails 150 or runners. Rails 148 and 150 are separated into pairs so as to provide surface areas for fastening clips 146. As described in U.S. patent application Ser. No. 14,909, filed Feb. 13, 1987, which is hereby incorporated by reference, right metal wall 144, in addition to providing a shield between tri-jack assemblies 50, also provides a signal ground for plugs (not shown) that are inserted into plug-receiving apertures 34a-c. Face bracket 142 is a vertical partition that mounts jack sleeves 36a-c for plug-receiving apertures 34a-c. Between the collars 38 of jack sleeves 36a and 36c are shoulders 152 which are built up more than the ends 154 of face bracket 142.

The function and operation of jacks are well known to those skilled in the art. Although jacks can have a variety of different internal circuit connections and can be used for a number of different applications, here jacks, in conjunction with printed circuit board conductor leads 58, provide a straight through circuit between wire wrap lugs 62 and 64 for digital or voice frequency communication signals when plugs are not inserted into plug-receiving apertures 34a-c. In order to interconnect different modules 14, or patch circuits, or to monitor or test circuits, plugs are inserted into plug-receiving apertures 34a-c. By using cables connected to the plugs, a straight through circuit path can be interrupted, and the circuit re-routed to a different jack module 14. Typically, the top aperture 34a is for monitoring, the middle aperture 34b is for OUT signals and the bottom aperture 34c is for IN signals.

In assembling a tri-jack module 14, the guide rails 148 are inserted into guide channel 130 of lamp housing 82 and guide rails 150 are inserted in guide channel 132 of bottom guide housing 54. Then, the tri-jack assembly 50 is pushed in along respective guide channels 130 and 132 until terminal pins 66 engage and make electrical contact within right-angle connector 56. In order to ensure that tri-jack assembly 50 is inserted right-side-up, guide rails 148 and 150 are keyed or polarized. More specifically, as shown in FIG. 2, the back guide rail 150 has a rearward notch 156, and guide channel 132 has an upwardly extending boss 158. If tri-jack assembly were inserted up-side-down, the back guide rail 148, which does not have a corresponding notch, would bump against boss 158 thereby preventing further insertion that could bend or damage terminal pins 66 by not properly aligning with right-angle connector 56. Referring to FIG. 5, there is shown an alternate embodiment for keying or polarizing guide rails 148 and 150. More specifically, guide rails 148 on top are laterally wider than guide rails 150 on the bottom, and guide channels 130 and 132 are correspondingly grooved. Accordingly, if attempts were made to insert tri-jack assembly 50 up-side-down, guide rail 148 would not insert into guide channel 132. Thus, tri-jack assembly 50 cannot be inserted in an inverted orientation.

After each tri-jack module 14 including printed circuit board 48, right-angle connector 56, lamp assembly 40, bottom guide housing 54, and tri-jack assembly 50 are fully assembled, the module 14 is ready for insertion into housing 12. As shown in FIG. 2, guide apparatus 46 includes top wafer guide 160, bottom wafer guide 162, and bus housing 164. Also referring to FIG. 3, top and bottom wafer guides 160 and 162 are respectively mounted on top and bottom plates 16 and 24, and extend laterally across jackfield housing 12. Top and bottom wafer guides 160 and 162 have a plurality of corresponding channels or grooves 166 which face each other and are aligned to form guide slots for receiving the top and bottom edges 168 and 170 of printed circuit board 48. Grooved bus housing 164 also extends laterally and has a plurality of channels or grooves 172 which align with channels 166. As shown in FIG. 3, there is a step partition 174 which runs laterally along the back of housing 12. Bus housing 164 has a horizontal section 176 which seats on top 178 of step partition 174. A suitable fastener 180 connects horizontal section 176 to step partition 174. The channels 172 of bus housing 164 are in horizontal section 176 so they engage the under side edge 182 of the rearward projection 76 of printed circuit board 48. In summary, the combination of channels 166 and 172 define guide slots for holding modules 14 in vertical alignment, and also align the respective wire wrap lugs 62 and 64 and conductor pads 68a-c to their proper lateral position. Wire wrap lugs 62 insert through an array of small openings 177 in dielectric insulator terminal block 186 and wire wrap lugs 64 insert through an array of small openings 177 in dielectric insulator terminal block 188. Wires (not shown) are then wire wrapped to the appropriate wire wrap lugs 62 and 64 for routing the proper signals.

Figure 6:
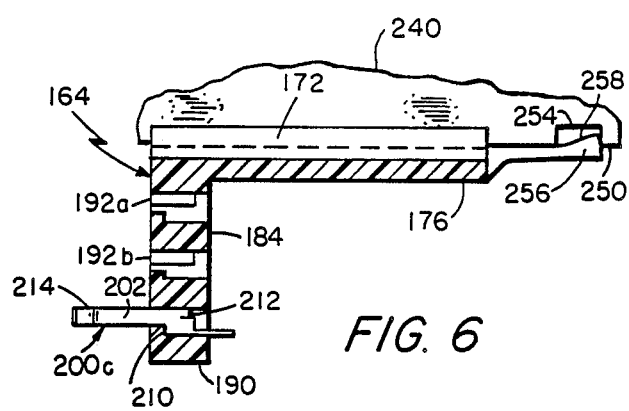
FIG. 6 is a side sectioned view of the bus housing.
Figure 7:
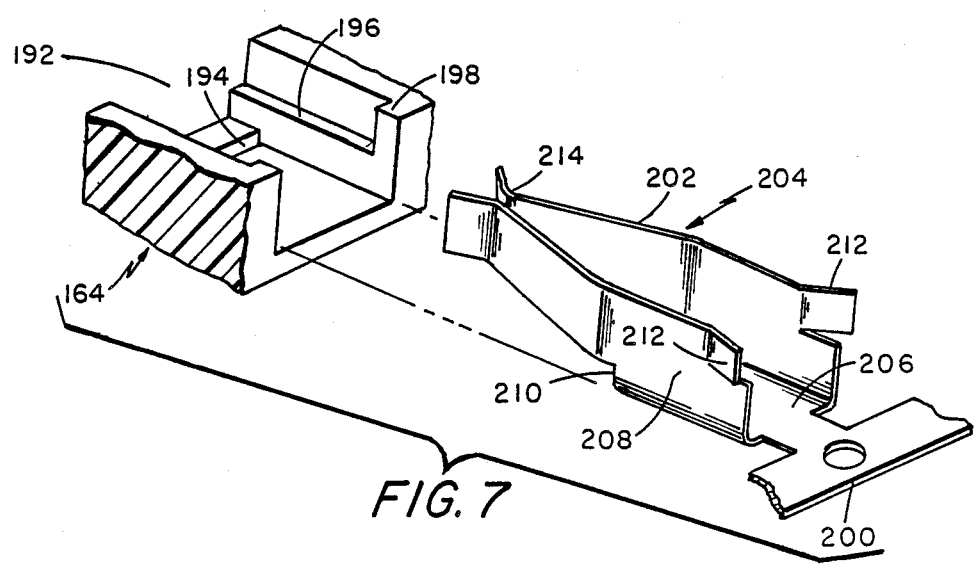
FIG. 7 is an exploded view of a bus projection and a portion of a bus housing slot.

Still referring to FIGS. 2 and 3 and also to FIGS. 6 and 7 which respectively show side sectioned and rear perspective views of bus housing 164, vertical section 190 of bus housing 164 extends downwardly parallel to front surface of step partition 174. Vertical section 190 is a dielectric insulator and has columns of three slots 192a-c which respectively align with channels 172. Each slot 192 has a step 194, ledges 196 at the sides, and stops 198 at the rear. Busses 200a-c are inserted so that a pair of contact springs 202 protrude forwardly from each slot 192. More specifically, each bus 200, of which there is one for each of three horizontal rows of slots 192, has a plurality of projections 204 which insert through slots 192 from the rear. Each projection 204 has a horizontal portion 206 that wraps up along the sides 208 and extends forwardly from a front edge 210 of the horizontal portion 206. At the back, the sides have respective ears 212 that extend outwardly, and a pair of contact springs 202 which slant inwardly through a contact region 214 where they bow outwardly. The projection 204 is pushed into the slot 192 from the rear until the front edge 210 contacts step 194 thereby preventing further movement to the front. At this position, ears 212 spring outwardly on both sides above ledges 196 and engage stops 198 to prevent motion toward the rear. The contact springs 202 extend forwardly from slots 192. The busses 200a-c electrically interconnect or daisy chain each of the projections 204 along one of the respective rows of slots 192. At the end, the top bus 200a is connected to −48 volts DC, the middle bus 200b is connected to ground, and the bottom bus 200c is used for signal ground. Summarizing, each slot 192 of each column has a pair of contact springs 202 extending forwardly and the springs 202 are firmly secured so that they cannot be pushed backwardly by printed circuit board 48 or drawn forwardly by the removal of printed circuit board 48. Also, each of the contact springs 202 on the top row 192a provides −48 volts DC, each of the contact springs 202 in the middle row 192b provides ground, and each of the contact springs 202 in the bottom row 192c provides signal ground. As module 14 is pushed to its fully inserted position as shown in FIG. 3, respective conductor pads 68a-c insert between respective contact springs 202 pushing them apart and making tensioned electrical contact between busses 200a, b and c, and the respective top, middle and bottom conductor pads 68a-c. Further, it is noted that dielectric insulator 188 extends upwardly between vertical section 190 of bus housing 164 and step partitions 174 to prevent busses 200a-c from contacting step partition 174.

Referring again to FIG. 3, conductor lead 58a on the facing side of printed circuit board 48 electrically interconnects conductor pad 68a with conductor strip 86b of lamp assembly 40. Also, conductor lead 58b on the facing side of printed circuit board 48 electrically interconnects conductor pad 68b with terminal 216 of right-angle connector 56. Further, conductor lead 58c, shown as a dotted line because it is routed on the opposite side of printed circuit board 48, electrically interconnects conductor strip 86a with terminal 218 of right-angle connector 56. Although many other circuit configurations could be used, conductor pads 68a and 68b are electrically connected across conductor strips 86a and 86b of lamp assembly 40 when a plug (not shown) is inserted into the top monitor jack sleeve 36a. More specifically, when a plug is inserted into jack sleeve 36a, spring contacts (not shown) internal to tri-jack assembly 50 are urged in the vertical direction thereby electrically interconnecting terminals 216 and 218 of right-angle connector 56. In this state, conductor pad 68b is electrically interconnected with conductor strip 86a. As a result, when a plug is inserted into the monitor jack sleeve 36a, −48 volts DC from bus 200a is connected to one side of lamp 42 via conductor pad 68a and conductor lead 58a, and ground from bus 200b is connected to the opposite side of lamp 42 via conductor pad 68b, conductor lead 58b, an internal circuit of tri-jack assembly 50, and conductor lead 58c. Accordingly, lamp 42 is lit when a plug is inserted into the monitor jack sleeve 36a.

Referring to FIGS. 8 and 9, front and side views of front plates or panels 26 and 28 are shown. Bottom front panel 28 extends laterally below the bottom of jack sleeves 36c and has a scalloped top edge 220 defining a series of semicircular notches 222 into which corresponding collars 38 of jack sleeves 36c fit. Similarly, top panel 26 extends laterally above the top jack sleeves 36a and has a scalloped bottom edge 224 defining a series of semicircular notches 226 into which corresponding collars 38 of jack sleeves 36a fit. Bottom panel 28 further has upwardly projecting arms 228 at the sides and preferably at the middle that extend upwardly and mate with top panel 26. More specifically, as shown in FIG. 9, the bottom edge 227a of top panel 26 and the top edge 227b of bottom panel 28 at the projecting arms 228 are beveled so that they interlock thereby eliminating any gap therebetween that would visually emphasize the fact that the top panel 26 and bottom panel 28 are two separate parts. Further, the shoulder 152 between jack sleeves 36a and jack sleeves 36c are built up to the level of top and bottom panels 26 and 28 making the front of housing 12 flat so as to provide the conventional appearance of having one front panel that covers the entire front.

Still referring to FIGS. 8 and 9, the front panel is split into top panel 26 and bottom panel 28 so that tri-jack assemblies 50 and/or tri-jack modules 14 may be removed or inserted from the front without disrupting service to any other active channels in the jackfield 10. More specifically, the front panel consisting of top panel 26 and bottom panel 28 may be removed without first unplugging plugs (not shown) that have interconnecting cables between different modules 14. Stated differently, even though two modules 14 are interconnected by a patch cable at the front, top and bottom panels 26 and 28 can be independently removed without interrupting the interconnection. Once the top and bottom front panels 26 and 28 are removed, tri-jack assemblies 50 and/or tri-jack modules 14 may be removed and replaced from the front, still without interrupting interconnected jack modules 14, unless, of course, the particular module 14 is between the interconnected modules 14 and the cable is relatively taut thereacross. Another important feature of top and bottom panels 26 and 28 is that their respective semicircular notches 222 and 226 clamp each module 14 from the top and bottom locking it securely in place. In particular, notches 227 and 226 engage sleeves 36a and 36c of each tri-jack assembly 50 preventing it from moving or wobbling which may be especially important if some module slots are not filled with modules 14. In other words, each module 14 is rigidly affixed in vertical and horizontal alignment by the combination of notches 222 and 226, and channels 166 and 172.

Referring again to FIG. 3, tri-jack assemblies 50 are removed by pulling them forwardly such that terminal pins 66 slidably disengage from right-angle connector 56 and respective guide rails 148 and 150 or runners slide forwardly within guide channels 130 and 132.

Front support plate 232 extends laterally across the front of jackfield assembly 10 and engages respective notches 234 of bottom guide housings 54 thereby preventing the printed circuit board 48 and the rest of the module 14 from moving forwardly by the force put on right-angle connector 56 by the removal of a tri-jack assembly 50.

If, instead of removing just tri-jack assembly 50, the intended operation is to remove the entire tri-jack module 14 for service or reconfiguration of electrical jackfield assembly 10, two additional steps are required. First, the wire wraps are removed from wire wrap lugs 62 and 64. Second, front support or retaining plate 232 is removed by removing screws 233. Then, the module 14 is free to be pulled forwardly and removed from housing 12. Wire wrap lugs 62 and 64 slide through their respective openings 177 in top and bottom terminal block sections 186 and 188, and conductor pads 68a–c slide out of engagement with the respective contact springs 202. For inserting a module 14 in housing 12, the process is reversed. Specifically, top and bottom edges 168 and 170 of printed circuit board 48 are correspondingly inserted into channels 166 of top and bottom nylon wafer guides 160 and 162, and the module 14 is pushed longitudinally towards the rear. The under edge 182 of rearward projection 76 of printed circuit board 48 engages a corresponding channel 172 in horizontal section 176 of bus housing 164 at a position further to the rear. In the installed position, wire wrap lugs or pins 62 insert through openings 177 in the array of top terminal block section 186 and wire wrap lugs or pins 64 insert through openings 177 in the array of bottom terminal block section 188. Also, conductor pads 68a–c automatically align with and engage corresponding contact springs 202 of respective busses 200a–c. Accordingly, −48 volts DC, ground, and signal ground are disengageably provided to the rear of module 14 such that module 14 can be longitudinally inserted and removed from the front of housing 12. Wire wrap lugs 62 and 64 are wire wrapped as described earlier herein. Next, after all of the desired modules 14 are inserted, front support plate 232 is affixed in place using screws 233. Then, the bottom and top front plates 28 and 26 are positioned in place and screws 32 are used to secure them. The neck 236 of the face portion 112 of each lamp housing 82 protrudes through window 44 and the back of top front plate 26 seats against shoulder 238 of the face portion 112 (FIG. 4).

Referring again to FIG. 2, metal plate shields 240 are slid longitudinally in from the front between the slots for modules 14 during initial assembly. Shields 240 function to suppress crosstalk between adjacent modules 14. Thin shield slots 242 are cut in between and parallel to channels 166 in guide wafers 160 and 162. Top and bottom edges 244 and 246 of shields 240 slidably engage shield slots 242. Further, shields 240 each have an upper rear projection 248 with an under edge 250 that slidably engages a guide slot 252 positioned parallel and in between channels 172 of bus housing 164. The under edge 250 of each shield 240 has a notch 254 which engages a flexible hook 256 extending from the rear of bus housing 164. More specifically, with reference to FIG. 6, the bottom edge 250 of shield 240 rides along ramp 258 during initial assembly thereby depressing hook 256. When notch 254 arrives at hook 256, hook 256 springs upward into notch 254 and thereby prevents removal of shield 240 to the front. Accordingly, shields 240 stay in place in housing 12 even though modules 14 may be removed for repair or replacement with other types of modules. If shields 240 could be pulled forwardly, a module 14 could be replaced and the shield 240 inadvertently left out.

This concludes the description of the preferred embodiment. A reading of it by those skilled in the art will bring to mind many modifications and alterations without departing from the spirit and scope of the invention. Accordingly, it is intended that the invention be limited only by the appended claims.

What is claimed is:

1. A jack module adapted for front insertion and removal from guide slots in a jackfield housing, comprising:
   a printed circuit board having front, rear, top and bottom edges, said top and bottom edges being insertable for longitudinal sliding engagement in said slots;
   a lamp having a lamp housing connected to and extending forwardly from a first portion of said front edge of said printed circuit board;
   an electrical connector attached to a second portion of said front edge of said printed circuit board;
   a jack extending forwardly from said printed circuit board, said jack having terminals removably engaged in said electrical connector, said jack having a forward facing face plate with at least one horizontal jack sleeve adapted for receiving a jack plug;
   said printed circuit board having at least one rear edge conductor pad adapted for sliding removable engagement with a contact spring terminal at the back of said jackfield housing wherein said jack module can be inserted from the front of said jackfield housing in one of said guide slots with said conductor pad electrically engaging said contact spring terminal, said printed circuit board having a conductor lead for interconnecting said conductor pad to said lamp;
   said printed circuit board further comprising a plurality of wire wrap lugs extending rearwardly from said rear edge, said printed circuit board having conductor leads interconnecting said lugs to said jack via said connector; and
   said jack comprising means responsive to insertion of a plug in said jack sleeve for lighting said lamp.

2. The module recited in claim 1 wherein said printed circuit board has at least a second rear conductor pad adapted for sliding removable engagement with a second contact spring terminal, said module further comprising a circuit through said jack interconnecting said second conductor pad with said lamp.

3. The module recited in claim 2 wherein said circuit from said conductor lead through said jack to said lamp is closed by said lighting means.

4. The jack module recited in claim 3 wherein said contact spring and said second contact spring terminals are connected to respective busses that provide a voltage and ground to said lamp for lighting said lamp in response to said plug being inserted into said jack.

5. A jackfield comprising:
   a jackfield housing having a plurality of longitudinal slots each having at least two vertically spaced apart contact spring terminal connectors aligned therewith, said contact spring terminal connectors on one of said levels being interconnected to a voltage bus, said contact spring terminal connectors on the other one of said levels being interconnected to a ground bus;

a plurality of jack modules slidably engaged along top and bottom edges in said longitudinal slots, each of said modules comprising:

(a) a printed circuit board having top and bottom edges slidably engaged in said slots of said housing;

(b) a lamp having a lamp housing connected to and extending forwardly from said printed circuit board;

(c) a jack removably connected to and extending forwardly from said printed circuit board underneath said lamp housing, said jack having a plurality of forward facing jack sleeves, said jack having a circuit activated by insertion of a plug in one of said jack sleeves, said jack being electrically connected to conductor leads on said printed circuit board;

(d) said printed circuit board having at least two rear conductor pads vertically aligned for respective removable engagement with said two vertically spaced apart contact spring terminal connectors wherein said module is removable from the front of said housing, one of said conductor pads being electrically interconnected with said lamp and the other of said conductor pads being electrically interconnected with said lamp through said circuit within said jack; and (e) said printed circuit board further comprising a plurality of wire wrap lugs extending rearwardly and a plurality of conductor leads for interconnecting said lugs to said jack.

6. The jackfield recited in claim 5 further comprising metal shields positioned between adjacent ones of said slots, said metal shields comprising means for preventing the removal of said shields toward the front of said housing.

* * * * *